(12) United States Patent
Li et al.

(10) Patent No.: US 10,292,253 B2
(45) Date of Patent: May 14, 2019

(54) HEAT-DISSIPATION AND SHIELDING STRUCTURE AND COMMUNICATIONS PRODUCT

(71) Applicant: Huawei Technologies Co., Ltd., Shenzhen (CN)

(72) Inventors: Xiaoqing Li, Wuhan (CN); Jinjing Jiang, Shenzhen (CN); Zhiguo Zhang, Wuhan (CN); Bin Wang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 6 days.

(21) Appl. No.: 15/518,970

(22) PCT Filed: Oct. 17, 2014

(86) PCT No.: PCT/CN2014/088835
§ 371 (c)(1),
(2) Date: Apr. 13, 2017

(87) PCT Pub. No.: WO2016/058182
PCT Pub. Date: Apr. 21, 2016

(65) Prior Publication Data
US 2017/0238410 A1    Aug. 17, 2017

(51) Int. Cl.
*H05K 1/02* (2006.01)
*C09J 9/02* (2006.01)
(Continued)

(52) U.S. Cl.
CPC .............. *H05K 1/0203* (2013.01); *C09J 9/02* (2013.01); *H01L 23/36* (2013.01);
(Continued)

(58) Field of Classification Search
CPC .... H05K 1/0203; H05K 7/20909; H05K 5/03; H05K 2201/10371; H05K 9/0009
See application file for complete search history.

(56) References Cited

U.S. PATENT DOCUMENTS 5,566,052 A    10/1996  Hughes
6,188,577 B1    2/2001  Liu
(Continued)

FOREIGN PATENT DOCUMENTS

CN    2790116 Y    6/2006
CN    2790120 Y    6/2006
(Continued)

OTHER PUBLICATIONS

Foreign Communication From A Counterpart Application, Chinese Application No. 201480069545.6, Chinese Office Action dated Dec. 25, 2017, 7 pages.
(Continued)

*Primary Examiner* — David M Sinclair
*Assistant Examiner* — Robert D Brown
(74) *Attorney, Agent, or Firm* — Conley Rose, P.C.

(57) ABSTRACT

A heat-dissipation and shielding structure, including a shielding case, a thermal pad, and a heat sink. The bottom of the shielding case is connected to a circuit board used to carry a heat emitting element, the heat sink is disposed on the top of the shielding case, the top of the shielding case is provided with an opening, the thermal pad runs through the opening, a bottom surface of the thermal pad is attached to the heat emitting element, and a top surface of the thermal pad is attached to the heat sink; and the heat-dissipation and shielding structure further includes a metal spring plate, where the metal spring plate is located on a periphery of the (Continued)

opening and encircles the opening, and the metal spring plate is elastically connected between the shielding case and the heat sink.

17 Claims, 2 Drawing Sheets

(51) Int. Cl.
    *H01L 23/367*     (2006.01)
    *H05K 9/00*     (2006.01)
    *H01L 23/36*     (2006.01)
    *H01L 23/42*     (2006.01)
    *H01L 23/552*     (2006.01)

(52) U.S. Cl.
    CPC ......... *H01L 23/3675* (2013.01); *H01L 23/42* (2013.01); *H01L 23/552* (2013.01); *H05K 1/0209* (2013.01); *H05K 1/0212* (2013.01); *H05K 9/0009* (2013.01); *H05K 9/0032* (2013.01); *C09J 2201/128* (2013.01); *C09J 2201/602* (2013.01); *C09J 2203/326* (2013.01); *H01L 2924/0002* (2013.01); *H05K 2201/066* (2013.01); *H05K 2201/0715* (2013.01); *H05K 2201/10371* (2013.01)

(56) References Cited

U.S. PATENT DOCUMENTS

| | | | |
|---|---|---|---|
| 6,208,516 B1* | 3/2001 | Fangonilo | H01L 23/4093 165/185 |
| 6,219,239 B1* | 4/2001 | Mellberg | H05K 7/1431 165/80.3 |
| 6,343,017 B1* | 1/2002 | Yu | H01L 23/4093 165/80.3 |
| 6,346,672 B1 | 2/2002 | Horng | |
| 6,639,800 B1 | 10/2003 | Eyman et al. | |
| 7,638,717 B1* | 12/2009 | Yeates | H05K 9/0032 174/377 |
| 9,048,124 B2* | 6/2015 | Dolci | H01L 23/10 |
| 2002/0101720 A1* | 8/2002 | Kline | H01L 23/3675 361/704 |
| 2003/0062179 A1* | 4/2003 | West | H05K 9/0032 174/382 |
| 2004/0052064 A1* | 3/2004 | Oliver | H01L 23/4093 361/816 |
| 2007/0086170 A1* | 4/2007 | Liang | H01L 23/367 361/719 |
| 2007/0211445 A1* | 9/2007 | Robinson | H01L 23/552 361/818 |
| 2009/0040731 A1 | 2/2009 | Jin et al. | |
| 2010/0142153 A1* | 6/2010 | Ho | H01L 23/3677 361/710 |
| 2010/0157544 A1 | 6/2010 | Tsao et al. | |
| 2013/0180105 A1* | 7/2013 | Moul | H01P 11/003 29/846 |
| 2014/0078677 A1* | 3/2014 | Dolci | H01L 23/10 361/719 |
| 2014/0247564 A1* | 9/2014 | Shi | H01L 23/4093 361/720 |
| 2016/0266622 A1 | 9/2016 | Zhao et al. | |
| 2017/0181264 A1* | 6/2017 | Brey | H05K 1/023 |

FOREIGN PATENT DOCUMENTS

| | | |
|---|---|---|
| CN | 201104378 Y | 8/2008 |
| CN | 201853688 U | 6/2011 |
| CN | 203722975 U | 7/2014 |

OTHER PUBLICATIONS

Machine Translation and Abstract of Chinese Publication No. CN2790116, Jun. 21, 2006, 8 pages.
Machine Translation and Abstract of Chinese Publication No. CN2790120, Jun. 21, 2006, 9 pages.
Machine Translation and Abstract of Chinese Publication No. CN201853688, Jun. 1, 2011, 6 pages.
Foreign Communication From A Counterpart Application, European Application No. 14904131.1, Extended European Search Report dated Aug. 24, 2017, 8 pages.
Foreign Communication From A Counterpart Application, PCT Application No. PCT/CN2014/088835, English Translations of International Search Report dated Jul. 21, 2015, 2 pages.
Foreign Communication From A Counterpart Application, PCT Application No. PCT/CN2014/088835, English Translations of Written Opinion dated Jul. 22, 2015, 5 pages.

* cited by examiner

HEAT-DISSIPATION AND SHIELDING STRUCTURE AND COMMUNICATIONS PRODUCT

CROSS-REFERENCE TO RELATED APPLICATIONS

This application is a National Stage of International Application No. PCT/CN2014/088835, filed on Oct. 17, 2014, which is hereby incorporated by reference in its entirety.

TECHNICAL FIELD

The present disclosure relates to an electromagnetic shielding structure, and in particular, to a heat-dissipation and shielding structure.

BACKGROUND

Communications terminal products include some chips producing relatively high heat, for example, a power amplifier (PA), and the chips producing relatively high heat generally need electromagnetic shielding and heat dissipation.

Power consumption of central processing units (CPUs) used by these products, for example, a set-top box and a gateway, is relatively great, and digital noise radiation is relatively great. Currently, a solution to heat dissipation and noise shielding mainly is a thermal pad is added above a CPU, a shielding case is further added above the thermal pad, a thermal pad is added above the shielding case, and a heat sink is added above the thermal pad. A total of five components are disposed in a superimposed manner. Though the solution can resolve a shielding problem, three layers of substances exist between a heat sink fin and the CPU. Consequently, heat dissipation effects are reduced. In some devices having a small size, heat dissipation cannot satisfy requirements, which does not facilitate a lightening and thinning design of a product.

SUMMARY

A technical problem to be resolved by the present disclosure is to provide a heat-dissipation and shielding structure, which has good heat-dissipation and shielding functions and facilitates a lightening and thinning design of a product.

To achieve the foregoing purpose, implementation manners of the present disclosure provide the following technical solution:

The present disclosure provides a heat-dissipation and shielding structure, including a shielding case, a thermal pad, and a heat sink, where the shielding case is used to shield a heat emitting element, the bottom of the shielding case is connected to a circuit board used to carry the heat emitting element, the heat sink is disposed on the top of the shielding case, the top of the shielding case is provided with an opening, the thermal pad runs through the opening, a bottom surface of the thermal pad is attached to the heat emitting element, and a top surface of the thermal pad is attached to the heat sink; and the heat-dissipation and shielding structure further including a metal spring plate, where the metal spring plate is located on a periphery of the opening and encircles the opening, and the metal spring plate is elastically connected between the shielding case and the heat sink, so that the heat sink and the shielding case together form a shielding enclosure encircling the heat emitting element.

The heat-dissipation and shielding structure further includes an electrically conductive double-sided tape or an electrically conductive foam, where the electrically conductive double-sided tape or the electrically conductive foam is disposed on a periphery of the metal spring plate, and the electrically conductive double-sided tape or the electrically conductive foam fixedly connects the heat sink to the top of the shielding case by means of adhering by an adhesive.

The electrically conductive double-sided tape or the electrically conductive foam is of an enclosed hollow structure.

The metal spring plate and the shielding case are integrally formed.

The metal spring plate includes multiple sheet-like members, where the multiple sheet-like members are distributed around the opening in spacing, one end of each sheet-like member is integrally connected to the top of the shielding case, the other end of the sheet-like member is a free end, the free end is adjacent to the opening, and each of the free ends is provided with a convex lug protruding towards the heat sink, and the convex lug is used to support the heat sink.

The free ends of the multiple sheet-like members together form a square space, the opening is of a square shape, and the convex lugs are all of a hemispherical shape.

The multiple sheet-like members are parallel to each other, and a rectilinear gap or a curvilinear gap is formed between neighboring sheet-like members.

A perpendicular distance between the neighboring sheet-like members ranges from $1/10$ of a wavelength to $1/20$ of the wavelength, where the wavelength is a wavelength of an electromagnetic wave of a wireless system interfered with by the heat emitting element.

The present disclosure further provides a communications product, including the heat-dissipation and shielding structure according to any one of the foregoing.

According to the heat-dissipation and shielding structure provided in the present disclosure, an opening is provided at the top of a shielding case, a thermal pad runs through the opening, a bottom surface of the thermal pad is attached to a heat emitting element, a top surface of the thermal pad is attached to a heat sink, and a metal spring plate is elastically connected between the shielding case and the heat sink, so that the heat sink and the shielding case together form a shielding enclosure encircling the heat emitting element, thereby improving the heat dissipation efficiency, and ensuring a shielding effect. Because heat of the heat emitting element is conducted to the heat sink by only the thermal pad running through the shielding case, an entire structure is simple, which facilitates a lightening and thinning design of a product.

BRIEF DESCRIPTION OF DRAWINGS

To describe the technical solutions in the embodiments of the present disclosure more clearly, the following briefly describes the accompanying drawings used for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the implementation manners of the present disclosure with reference to the accompanying drawings in the implementation manners of the present disclosure.

The present disclosure provides a heat-dissipation and shielding structure and a communications product including the heat-dissipation and shielding structure, and the communications product may be a set-up box, a gateway, a fastened platform, a mobile terminal, or the like.

Figure 1:
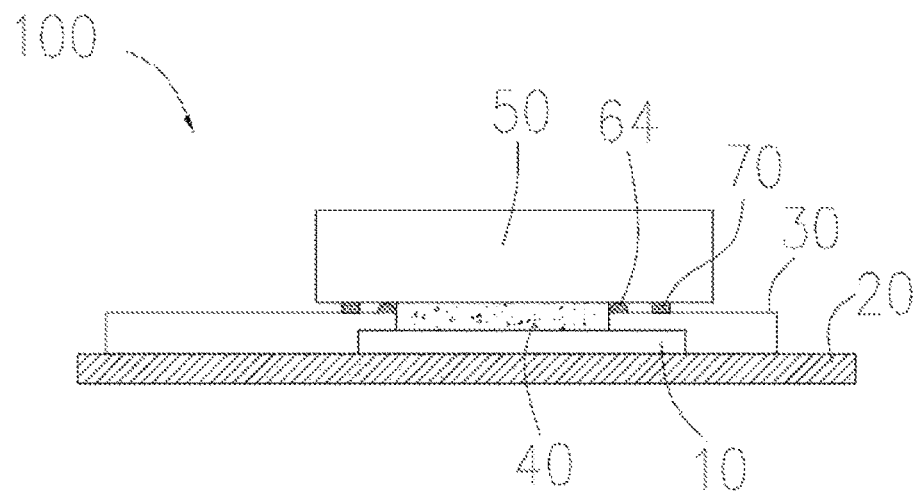
FIG. 1 is a schematic sectional view of a heat-dissipation and shielding structure according to an implementation manner of the present disclosure.
Figure 2:
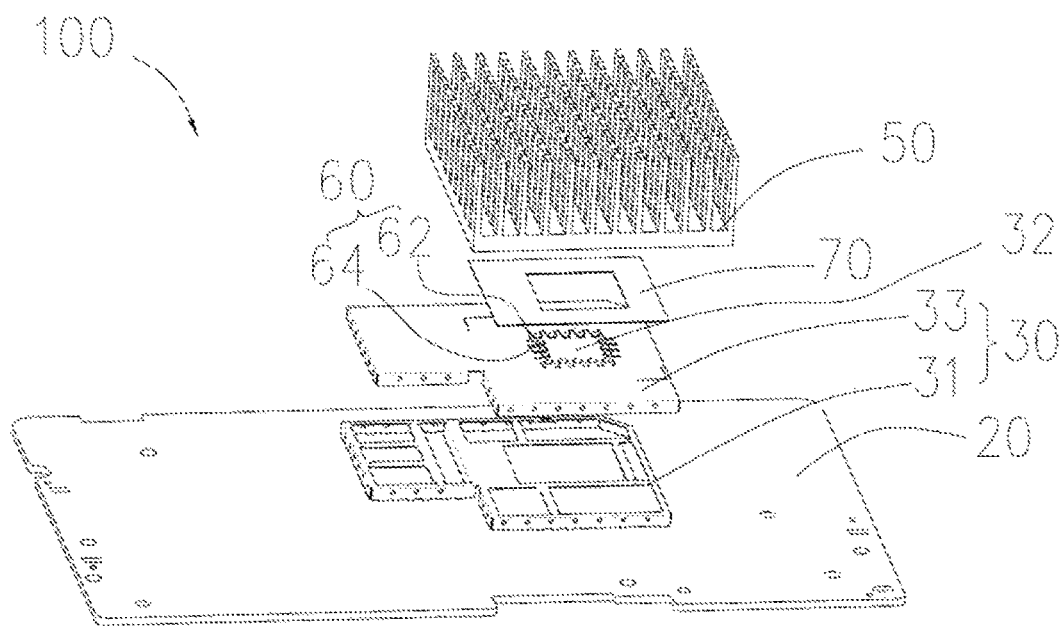
FIG. 2 is a schematic three-dimensional exploded view of the heat-dissipation and shielding structure according to an implementation manner of the present disclosure.
Figure 3:
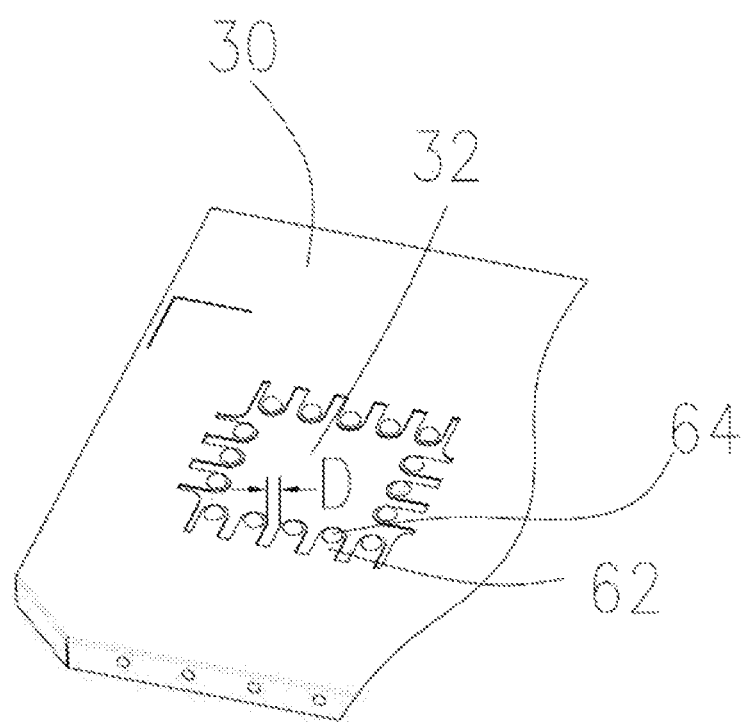
FIG. 3 is a locally enlarged schematic view of a shielding case of the heat-dissipation and shielding structure according to an implementation manner of the present disclosure.

Referring to FIG. 1 and FIG. 2, a heat-dissipation and shielding structure 100 includes a shielding case 30, a thermal pad 40, and a heat sink 50. A heat emitting element 10 is disposed on a circuit board 20. In this implementation manner, the heat emitting element 10 is a CPU. The shielding case 30 is used to shield the heat emitting element 10, the bottom of the shielding case 30 is connected to the circuit board 20 used to carry the heat emitting element 10, and the heat sink 50 is disposed on the top of the shielding case 30. The top of the shielding case 30 is provided with an opening 32. In this implementation manner, the shielding case 30 includes a shielding frame 31 and a cover 33, the shielding frame 31 is fixedly connected to the circuit board 20, and the shielding frame 31 may be fastened to the circuit board 20 in a welding or SMT manner. The cover 33 and the shielding frame 31 match to form a shielding space encircling the heat emitting element 10. Side edges of the cover 33 match the shielding frame 31 in a concave-convex manner, to implement a connection between the two. For example, bumps are provided at the side edges of the cover 33, dents are provided on an outer surface of the shielding frame, and the shielding frame 31 is fastened to the cover 33 by means of one-to-one matching between the bumps and the dents. A distance between neighboring bumps ranges from $1/10$ of a wavelength to $1/20$ of the wavelength. The wavelength is a wavelength of an electromagnetic wave of a wireless system interfered with by the heat emitting element 10. This distance can ensure that the electromagnetic wave is not leaked. Therefore, the heat-dissipation and shielding structure 100 has a good shielding effect.

The thermal pad 40 runs through the opening 32, a bottom surface of the thermal pad 40 is attached to the heat emitting element 10, and a top surface of the thermal pad 40 is attached to the heat sink 50. The heat-dissipation and shielding structure 100 further includes a metal spring plate 60. The metal spring plate 60 is located on a periphery of the opening 32 and encircles the opening 32, and the metal spring plate 60 is elastically connected between the shielding case 30 and the heat sink 50, so that the heat sink 50 and the shielding case 30 together form a shielding enclosure encircling the heat emitting element 10.

According to the heat-dissipation and shielding structure 100 provided in the present disclosure, an opening 32 is provided at the top of a shielding case 30, a thermal pad 40 runs through the opening 32, a bottom surface of the thermal pad 40 is attached to a heat emitting element 10, a top surface of the thermal pad 40 is attached to a heat sink 50, and a metal spring plate 60 is elastically connected between the shielding case 30 and the heat sink 50, so that the heat sink 50 and the shielding case 30 together form a shielding enclosure encircling the heat emitting element 10, thereby improving the heat dissipation efficiency, and ensuring a shielding effect. Because heat of the heat emitting element 10 is conducted to the heat sink 50 by only the thermal pad 40 running through the shielding case 30, an entire structure is simple, which facilitates a lightening and thinning design of a product.

In this implementation manner, the heat-dissipation and shielding structure 100 further includes an electrically conductive double-sided tape or an electrically conductive foam 70. The electrically conductive double-sided tape or the electrically conductive foam 70 is disposed on a periphery of the metal spring plate 60, and the electrically conductive double-sided tape or the electrically conductive foam 70 fixedly connects the heat sink 50 to the top of the shielding case 30 by means of adhering by an adhesive. The electrically conductive double-sided tape fixes the shielding case 30 and the heat sink 50 by using glue of the electrically conductive double-sided tape itself. Because there is no glue on two surfaces of the electrically conductive foam, additional glue needs to be gummed on the two surfaces of the electrically conductive foam, to adhere the electrically conductive foam between the heat sink 50 and the shielding case 30. The heat sink 50 is fastened to the shielding case 30 by means of the electrically conductive double-sided tape or the electrically conductive foam 70, and meanwhile, the metal spring plate 60 generates enough elastic deformation, to stably abut between the heat sink 50 and the shielding case 30, so that the shielding effect of the heat-dissipation and shielding structure 100 can be ensured. Besides, the electrically conductive double-sided tape or the electrically conductive foam 70 can be used as a shielding material and encircle the metal spring plate 60, thereby further improving the shielding effect. In this implementation manner, the electrically conductive double-sided tape or the electrically conductive foam 70 is of an enclosed hollow structure.

In this implementation manner, the metal spring plate 60 and the shielding case 30 are integrally formed. In another implementation manner, the metal spring plate 60 may be set as an independent element and is sandwiched between the shielding case 30 and the heat sink 50. An integrally formed structure simplifies the heat-dissipation and shielding structure 100 of the present disclosure, facilitates lightening and thinning development of a product, and facilitates assembly.

The metal spring plate 60 includes multiple sheet-like members 62. The multiple sheet-like members 62 are distributed around the opening 32 in spacing, one end of each sheet-like member 62 is integrally connected to the top of the shielding case 30, the other end of the sheet-like member is a free end, the free end is adjacent to the opening 32, each of the free ends is provided with a convex lug 64 protruding towards the heat sink 50, and the convex lug 64 is used to support the heat sink 50.

In this implementation manner, the free ends of the multiple sheet-like members 62 together form a square space, the opening 32 is of a square shape, and the convex lugs 64 are all of a hemispherical shape.

In this implementation manner, the multiple sheet-like members 62 are parallel to each other, and a rectilinear gap or a curvilinear gap is formed between neighboring sheet-like members 62. A perpendicular distance D between the neighboring sheet-like members 62 ranges from $1/10$ of the wavelength to $1/20$ of the wavelength, where the wavelength is the wavelength of the electromagnetic wave of the wireless system interfered with by the heat emitting element 10. This distance can ensure that the electromagnetic wave is not leaked. Therefore, the heat-dissipation and shielding structure 100 has a good shielding effect.

The foregoing descriptions are exemplary implementation manners of the present disclosure. It should be noted that a person of ordinary skill in the art may make certain improvements and polishing without departing from the principle of the present disclosure and the improvements and polishing shall fall within the protection scope of the present disclosure.

What is claimed is:

1. A heat-dissipation and shielding structure, comprising:
a heat sink;
a thermal pad attached to the heat sink; and
a shielding case comprising a spring plate located around a periphery of an opening, a first side of the shielding case being configured to couple to a circuit board comprising a heat emitting element, the heat sink being disposed on a second side of the shielding case, the thermal pad being located in the opening, the thermal pad being configured to attach to the heat emitting element, the circuit board, the shielding case, and the heat sink being configured to form a shielding enclosure surrounding the heat emitting element, the spring plate comprising multiple sheet-like members, the sheet-like members being distributed around the opening, one end of each sheet-like member being integrally coupled to the shielding case, another end of each sheet-like member being a free end, the free end being adjacent to the opening, each of the free ends comprising a convex lug protruding towards the heat sink, the convex lugs being hemispherical, the convex lugs supporting the heat sink, the spring plate with the sheet-like members comprising a planar structure such that all of the sheet-like members lie flat in a same plane, a gap being formed between the spring plate and the heat sink, the convex lugs fitting within the gap, and each of the convex lugs having a first side in contact with one of the sheet-like members and a second side in contact with the heat sink.

2. The heat-dissipation and shielding structure of claim 1, further comprising an electrically conductive double-sided tape or an electrically conductive foam, the electrically conductive double-sided tape or the electrically conductive foam being disposed on a periphery of the spring plate, and the electrically conductive double-sided tape or the electrically conductive foam fixedly coupling the heat sink to the second side of the shielding case using an adhesive.

3. The heat-dissipation and shielding structure of claim 2, wherein the electrically conductive double-sided tape or the electrically conductive foam has an enclosed hollow structure.

4. The heat-dissipation and shielding structure of claim 1, wherein the spring plate and the shielding case are integrally formed.

5. The heat-dissipation and shielding structure of claim 1, wherein the free ends together form a square, and the opening is square.

6. The heat-dissipation and shielding structure of claim 1, wherein the sheet-like members are parallel to each other, and a rectilinear gap or a curvilinear gap is formed between each sheet-like member.

7. The heat-dissipation and shielding structure of claim 1, wherein a perpendicular distance between the sheet-like members ranges from $1/10$ of a wavelength to $1/20$ of the wavelength, and the wavelength is a length of an electromagnetic wave of a wireless system interfered with by the heat emitting element.

8. A communications product, comprising:
a heat-dissipation and shielding structure, comprising:
a heat sink;
a thermal pad attached to the heat sink; and
a shielding case comprising a spring plate located around a periphery of an opening, a first side of the shielding case being configured to couple to a circuit board comprising a heat emitting element, the heat sink being disposed on a second side of the shielding case, the thermal pad being located in the opening, a bottom surface of the thermal pad being configured to attach to the heat emitting element, a top surface of the thermal pad being attached to the heat sink, the circuit board, the shielding case, and the heat sink being configured to form a shielding enclosure surrounding the heat emitting element, the spring plate comprising multiple sheet-like members, the sheet-like members being distributed around the opening, one end of each sheet-like member being integrally coupled to the shielding case, another end of each sheet-like member being a free end, the free end being adjacent to the opening, each of the free ends comprising a convex lug protruding towards the heat sink, the convex lugs being hemispherical, the convex lugs supporting the heat sink, the spring plate with the sheet-like members comprising a planar structure such that all of the sheet-like members lie flat in a same plane, a gap being formed between the spring plate and the heat sink, the convex lugs fitting within the gap, and each of the convex lugs having a first side in contact with one of the sheet-like members and a second side in contact with the heat sink.

9. The communications product of claim 8, further comprising an electrically conductive double-sided tape or an electrically conductive foam, the electrically conductive double-sided tape or the electrically conductive foam being disposed on a periphery of the spring plate, and the electrically conductive double-sided tape or the electrically conductive foam fixedly coupling the heat sink to the top surface of the shielding case using an adhesive.

10. The communications product of claim 9, wherein the electrically conductive double-sided tape or the electrically conductive foam has an enclosed hollow structure.

11. The communications product of claim 8, wherein the spring plate and the shielding case are integrally formed.

12. The communications product of claim 8, wherein the free ends together form a square shape, and the opening is the square shape.

13. The communications product of claim 8, wherein the sheet-like members are parallel to each other, and a rectilinear gap or a curvilinear gap is formed between neighboring sheet-like members.

14. The communications product of claim 8, wherein a perpendicular distance between the sheet-like members ranges from $1/10$ of a wavelength to $1/20$ of the wavelength, and the wavelength is a length of an electromagnetic wave of a wireless system interfered with by the heat emitting element.

15. An apparatus, comprising:
a circuit board comprising a heat emitting element;
a shielding case attached to the circuit board and comprising a spring plate, the spring plate defining an opening;
a thermal pad adjacent to the heat emitting element and located within the opening; and a heat sink adjacent to the thermal pad, the circuit board, the shielding case, the thermal pad, and the heat sink forming a shielding enclosure that surrounds the heat emitting element, the spring plate comprising a plurality of lugs that contact the heat sink, the spring plate comprising a plurality of members extending into the opening, each member comprising one of the lugs, each of the lugs comprising a convex lug protruding towards the heat sink, the convex lugs being hemispherical, the convex lugs supporting the heat sink, the spring plate with the sheet-like members comprising a planar structure such that all of the sheet-like members lie flat in a same plane, a gap being formed between the spring plate and the heat sink, the convex lugs fitting within the gap, and each of the convex lugs having a first side in contact with one of the sheet-like members and a second side in contact with the heat sink.

16. The apparatus of claim 15, further comprising an electrically conductive element that couples the heat sink to the shielding case, the shielding case at least partially covering the heat emitting element.

17. The apparatus of claim 15, wherein a distance between the members is from $\frac{1}{10}$ of a wavelength to $\frac{1}{20}$ of the wavelength, and the wavelength is a length of an electromagnetic wave of a wireless system interfered with by the heat emitting element.

\* \* \* \* \*

UNITED STATES PATENT AND TRADEMARK OFFICE
CERTIFICATE OF CORRECTION

PATENT NO. : 10,292,253 B2
APPLICATION NO. : 15/518970
DATED : May 14, 2019
INVENTOR(S) : Xiaoqing Li et al.

Page 1 of 1

It is certified that error appears in the above-identified patent and that said Letters Patent is hereby corrected as shown below:

In the Claims

Column 7, Line 1: "hoard" should read "board"

Signed and Sealed this
Thirtieth Day of July, 2019

Andrei Iancu
*Director of the United States Patent and Trademark Office*